United States Patent

Shimane et al.

(10) Patent No.: US 9,905,441 B2
(45) Date of Patent: Feb. 27, 2018

(54) OXIDATION PROCESS APPARATUS, OXIDATION METHOD, AND METHOD FOR MANUFACTURING ELECTRONIC DEVICE

(71) Applicant: CANON ANELVA CORPORATION, Kawasaki-shi, Kanagawa (JP)

(72) Inventors: Yoshimitsu Shimane, Kawasaki (JP); Takuya Seino, Kawasaki (JP)

(73) Assignee: CANON ANELVA CORPORATION, Kawasaki-Shi (JP)

(*) Notice: Subject to any disclaimer, the term of this patent is extended or adjusted under 35 U.S.C. 154(b) by 0 days.

(21) Appl. No.: 14/742,067

(22) Filed: Jun. 17, 2015

(65) Prior Publication Data

US 2015/0318466 A1 Nov. 5, 2015

Related U.S. Application Data

(63) Continuation of application No. PCT/JP2013/005969, filed on Oct. 8, 2013.

(30) Foreign Application Priority Data

Dec. 20, 2012 (JP) ................................. 2012-278267

(51) Int. Cl.
*H01L 43/12* (2006.01)
*H01L 21/67* (2006.01)
(Continued)

(52) U.S. Cl.
CPC .......... *H01L 21/67109* (2013.01); *C23C 8/10* (2013.01); *C23C 14/16* (2013.01);
(Continued)

(58) Field of Classification Search
CPC ........ C23C 16/45544; C23C 16/45551; C23C 16/45527; C23C 16/45563;
(Continued)

(56) References Cited

U.S. PATENT DOCUMENTS 5,972,116 A 10/1999 Takagi
6,248,672 B1 6/2001 Takagi
(Continued)

FOREIGN PATENT DOCUMENTS

CN 102017096 A 4/2011
JP 60-115226 A 6/1985
(Continued)

OTHER PUBLICATIONS

Official Letter issued in Taiwan Patent Application No. 102146655, dated Dec. 9, 2015 (11 pages).
(Continued)

*Primary Examiner* — Jessica Manno
*Assistant Examiner* — Mohammed R Alam
(74) *Attorney, Agent, or Firm* — Fitzpatrick, Cella, Harper & Scinto

(57) ABSTRACT

An oxidation process apparatus according to one embodiment of the present invention includes: a substrate holder provided in a processing chamber and having a substrate holding surface; a gas introduction unit for introducing an oxygen gas; a cylindrical member; and a substrate holder drive unit for changing relative positions of the substrate holder and the cylindrical member to allow the substrate holding surface and the cylindrical member to form an oxidation process space. The cylindrical member is provided so as to form a gap between the cylindrical member and the substrate holder during formation of the space. The oxygen gas is introduced restrictively into the space. The oxygen gas introduced from the gas introduction unit is evacuated through the gap.

24 Claims, 6 Drawing Sheets

(51) Int. Cl.

| | | |
|---|---|---|
| *C23C 16/458* | (2006.01) | |
| *C23C 16/455* | (2006.01) | |
| *C23C 16/46* | (2006.01) | |
| *C23C 8/10* | (2006.01) | |
| *C23C 14/16* | (2006.01) | |
| *C23C 14/58* | (2006.01) | |

(52) U.S. Cl.
CPC ........ *C23C 14/5853* (2013.01); *C23C 16/458* (2013.01); *C23C 16/45565* (2013.01); *C23C 16/46* (2013.01); *H01L 43/12* (2013.01)

(58) Field of Classification Search
CPC ......... C23C 16/45517; H01L 21/02197; H01L 21/02164; H01L 21/0228; B29C 66/71
See application file for complete search history.

(56) References Cited

U.S. PATENT DOCUMENTS

| | | | |
|---|---|---|---|
| 6,768,627 | B1 | 7/2004 | Kitabayashi et al. |
| 7,209,339 | B2 | 4/2007 | Kitabayashi et al. |
| 8,993,351 | B2 | 3/2015 | Yamamoto et al. |
| 2006/0207507 | A1* | 9/2006 | Oohashi ............ H01J 37/32724 118/725 |
| 2007/0160507 | A1* | 7/2007 | Satoh ................. C23C 16/4586 422/135 |
| 2008/0072821 | A1* | 3/2008 | Dalton .................... C30B 25/14 118/715 |
| 2011/0226178 | A1* | 9/2011 | Tsuji ................. C23C 16/45517 118/50 |
| 2014/0353149 | A1 | 12/2014 | Seino et al. |

FOREIGN PATENT DOCUMENTS

| | | |
|---|---|---|
| JP | 8-186081 A | 7/1996 |
| JP | 2001-313258 A | 11/2001 |
| JP | 2009-529223 A | 8/2009 |
| JP | 2010-87238 A | 4/2010 |
| TW | 508716 B | 11/2002 |
| TW | 200829713 A | 7/2008 |
| WO | 2012/086183 A1 | 6/2012 |

OTHER PUBLICATIONS

Oh, S.C., et al., "Magnetic and Electrical Properties of Magnetic Tunnel Junctions With Radical Oxidized MgO Barriers," IEEE Transactions on Magnetics, vol. 42, No. 10, pp. 2642-2644 (2006).

Ikeda, S., et al., "A Perpendicular-Anisotropy CoFeB—MgO Magnetic Tunnel Junction," Nature Materials, vol. 9, pp. 721-724 (2010).

Choi, Y., et al., "Novel Stack Structure of Magnetic Tunnel Junction with MgO Tunnel Barrier Prepared by Oxidation Methods: Preferred Grain Growth Promotion Seed Layers and Bi-layered Pinned Layer," Japanese Journal of Applied Physics, vol. 48, pp. 120124-1-120124-3 (2009).

Worledge, D.C., et al., "Spin Torque Switching of Perpendicular Ta/CoFeB/MgO-based Magnetic Tunnel Junctions," Applied Physics Letters, vol. 98, pp. 022501-1-022501-3 (2011).

Kubota, H., et al., "Enhancement of Perpendicular Magnetic Anisotropy in FeB Free Layers Using a Thin MgO Cap Layer," Journal of Applied Physics, vol. 111, pp. 07C723-1-07C723-3 (2012).

* cited by examiner

OXIDATION PROCESS APPARATUS, OXIDATION METHOD, AND METHOD FOR MANUFACTURING ELECTRONIC DEVICE

CROSS-REFERENCES TO RELATED APPLICATIONS

This application is a continuation application of International Application No. PCT/JP2013/005969, filed Oct. 8, 2013, which claims the benefit of Japanese Patent Application No. 2012-278267 filed Dec. 20, 2012. The contents of the aforementioned applications are incorporated herein by reference in their entireties.

TECHNICAL FIELD

The present invention relates to an oxidation process apparatus, an oxidation method, and a method for manufacturing an electronic device, and more particularly to an oxidation process apparatus for oxidizing one element of an electronic device (for example, a tunnel magnetoresistive element), an oxidation method, and a method for manufacturing an electronic device.

BACKGROUND ART

Heretofore, a magnetoresistive change element has been used mainly as an element for reading in a magnetic field from media of a hard disk drive. The magnetoresistive element utilizes a magnetoresistive effect of changing electrical resistance by application of a magnetic field to the element, and hard disk drive industry uses a TMR head using a tunnel magneto resistance (TMR) effect of exhibiting a greater rate of resistance change than that of a GMR head using a giant magneto resistance (GMR) effect, which in turn achieves a dramatic improvement in record density. Meanwhile, MRAM (magnetic random access memory) which is an integrated magnetic memory achieved by integrating this TMR technology with a semiconductor element has already started its commercialization. The MRAM includes a TMR element made of a magnetic material, formed on top of a semiconductor device, as distinct from SRAM (static RAM) or DRAM (dynamic RAM) which has hitherto been formed of a semiconductor element alone. Moreover, the MRAM enables a dramatic improvement in power consumption because of its non-volatility, and is thus expected to achieve larger capacity, in mobile communication market.

The MRAM uses, as the TMR element, an element of an in-plane magnetization type in which a direction of magnetization of a free layer and a reference layer spins in a direction perpendicular to a direction of a multilayer film, as disclosed in Non Patent Document 1. The MRAM poses the problem of being incapable of large storage capacity because of its large memory cell for storing data. By recent research and development, however, STT (Spin Transfer Torque)-MRAM using spin injection can be expected to overcome a drawback inherent in the MRAM and hence achieve larger capacity. This technology can change a direction of magnetization of the magnetic material by utilizing magnetic moment produced by spin of electrons, thus enabling miniaturization and also a reduction in a current value required for writing of data. Therefore, the STT-MRAM can operate even with a small-sized element and is thus suitable for higher density. The STT-MRAM uses the element of the in-plane magnetization type as is the case with the MRAM, and an element of a perpendicular magnetization type in which the direction of magnetization of the free layer and the reference layer spins in the same direction as the direction of the multilayer film. A typical multilayer film structure of the perpendicular magnetization type is disclosed in Non Patent Document 2. Further, research and development of materials and structures is stepped up so that magnetization can reverse even with the small-sized element, and there has also been a report on a structure in which an oxide layer is formed on top of the free layer, as disclosed in Non Patent Document 3.

Manufacture of the TMR element not only uses the structures disclosed in Non Patent Documents 1 and 2, but also widely uses a sputtering deposition (hereinafter, also called merely sputtering) method which involves sputtering a target made of a desired deposition material thereby to deposit a film on a facing substrate (see Patent Document 1). Further, there is a need for a crystallization annealing device for improving the rate of resistance change of the element, a substrate cooling device subsequent to annealing, and an oxidation device for forming the oxide layer, as well as a sputtering device. In the future, making full use of these devices for development of high-performance element structures as well as materials is essential in order to achieve practical use of STT-MRAM.

CITATION LIST

Patent Document

Patent Document 1: International Patent Publication No. WO2012/086183

Non Patent Document

Non Patent Document 1: Young-suk Choi et al., Journal of Appl. Phys. 48 (2009) 120214
Non Patent Document 2: D. C. Worledge et al., Appl. Phys. Lett. 98 (2011) 022501
Non Patent Document 3: Kubota et al., Journal of Appl. Phys. 111, 07C723 (2012)

SUMMARY OF INVENTION

However, the above-mentioned technologies have problems as given below.

In the manufacturing method disclosed in Patent Document 1, a structure obtained by sputtering four kinds of materials, namely, Ta, Ru, CoFeB, and MgO, is disclosed as the multilayer film of the perpendicular magnetization type; however, higher density involves a more complicated STT-RAM multilayer structure and thus requires forming more multilayer films. Specifically, this is the structure disclosed in Non Patent Document 2. Meanwhile, MgO is formed by forming an MgO target as an insulator by RF sputtering, or is formed by forming Mg as an electrical conductor by DC sputtering or RF sputtering, and then subjecting Mg to an oxidation process.

In the MRAM, it is important to control a coupling state of Mg and O atoms at a CoFeB/MgO/CoFeB interface in order to increase the rate of resistance change, and the MRAM poses the problem of needing to reduce an in-plane RA distribution (or a product of resistance and element area). If the rate of resistance change is low, ON/OFF signals cannot be separated, and thus, the MRAM does not function as memory. Also, if the RA distribution is poor, an MRAM element formed in a plane cannot be turned on and off, and thus, the MRAM does not function as memory. Thus, there arises the problem of needing to increase the rate of resistance change and thereby further improve the in-plane RA distribution.

Heretofore, in an oxidation process of a certain film, a space surrounded by an inner wall of an oxidation process chamber has formed an oxidation process space for oxidation by introduction of oxygen into the oxidation process chamber. In the oxidation process, the oxygen may be adsorbed on the inner wall of the oxidation process chamber as a wall which partitions the oxidation process space. Adsorption of the oxygen on the inner wall causes release of an oxygen gas from a portion of the inner wall on which the oxygen is adsorbed. Therefore, even when the oxidation process is finished and then the oxidation process chamber is evacuated, the adsorbed oxygen remains on the portion of the inner wall, so that the release of the oxygen gas from the portion of the inner wall continues. Thus, even if evacuation takes place, when the release of the oxygen gas from the wall which partitions the oxidation process space continues, element characteristics (an MR ratio or the RA distribution) are not stable. For example, even when for a certain oxidation process, an oxygen gas is introduced into the oxidation process chamber to perform the oxidation process and then the oxygen gas is evacuated after completion of the oxidation process, the oxygen gas may remain. Then, at the time of start of an oxidation process of a subsequent substrate, a larger-than-expected amount of oxygen gas is already present in the oxidation process chamber, and thus, the oxidation process proceeds by residual oxygen. In other words, an unintended oxidation process proceeds, so that the oxidation process is excessively performed. Thus, the excessive oxidation process leads to deterioration in the MR ratio or the RA distribution. Further, effective oxidation process time may vary from one oxidation process to another, which in turn leads to instability of the element characteristics such as the MR ratio or the RA distribution among fabricated elements.

Moreover, unless a duration of stay of the oxygen gas in the oxidation process chamber is reduced, throughput slows down, which in turn leads to deterioration in productivity and hence to an increase in cost for a semiconductor device. There exists the problem of needing to perform an oxidation process for formation of a desired MgO film in a short time, while suppressing a reduction in the throughput. Further, the oxygen gas remains in the oxidation process chamber and hence a time for evacuation to a predetermined pressure after the oxidation process becomes long, and thus, the throughput may become slower. Moreover, adsorption of impurities on the interface leads to the problem of causing the occurrence of a crystal defect or deterioration in the characteristics in a metal multilayer film structure.

Moreover, in manufacture of the MRAM element, formation of an MgO film to form a tunnel barrier layer requires achieving a proper degree of oxidation in the oxidation process chamber. In stages before achievement of this, such as in course of wafer transfer, it is desirable that unnecessary oxidation do not occur. Also for this purpose, there is a desire for size reduction in an oxidation process apparatus.

Further, in the sputtering device disclosed in Patent Document 1, a configuration is disclosed in which an oxidation chamber, a heating chamber, a cleaning (etching) chamber, and four sputtering chambers each having three targets are connected to one substrate transport chamber including a substrate introduction chamber. However, Patent Document 1 provides no disclosure of a means for improving the throughput, and solving the problem of the occurrence of the crystal defect or the deterioration in the characteristics in the metal multilayer film structure due to the adsorption of the impurities on the interface.

The present invention has been made in view of the foregoing problems. An object of the present invention is to provide an oxidation process apparatus, an oxidation method, and a method for manufacturing an electronic device, which, when oxidizing a substrate, enable reducing the amount of oxygen adsorbed on a wall which partitions an oxidation process space, improving throughput, and reducing mixing of impurities into a film (for example, a magnetic film) formed on the substrate subjected to an oxidation process.

In order to attain the above object, according to a first aspect of the present invention, there is provided an oxidation process apparatus for performing an oxidation process on a substrate, including: a processing chamber; a substrate holder provided in the processing chamber and having a substrate holding surface for holding the substrate; an oxygen gas introduction means for introducing an oxygen gas into the processing chamber; a surrounding portion provided in the processing chamber; and a position changing means for changing relative positions of the substrate holder and the surrounding portion to allow the substrate holding surface and the surrounding portion to form a space, wherein the surrounding portion is provided so as to, during formation of the space, surround the substrate holding surface and form a gap between the surrounding portion and the substrate holder, wherein the gas introduction means is provided so as to, during the oxidation process, introduce the oxygen gas restrictively into the space formed in the processing chamber, wherein the oxygen gas introduced from the oxygen gas introduction means into the space is evacuated from the space through the gap.

According to a second aspect of the present invention, there is provided an oxidation method for performing an oxidation process on a substrate, including the steps of: holding the substrate on a substrate holding surface of a substrate holder provided in a processing chamber; changing a relative position of the substrate holder with respect to the processing chamber thereby to form, in the processing chamber, a space formed by the substrate holding surface and a surrounding portion provided in the processing chamber, wherein the space is formed so that the substrate holding surface is surrounded by the surrounding portion and a gap is formed between the surrounding portion and the substrate holder; and performing the oxidation process on the substrate held on the substrate holding surface, by introducing an oxygen gas restrictively into the space, wherein the oxygen gas introduced into the space is evacuated from the space through the gap.

According to the present invention, it is possible to, in oxidation of a substrate, reduce the amount of oxygen adsorbed on a wall which partitions an oxidation process space, improve throughput, and reduce mixing of impurities into a film (for example, a magnetic film) formed on the substrate subjected to an oxidation process.

DESCRIPTION OF EMBODIMENTS

Figure 1:
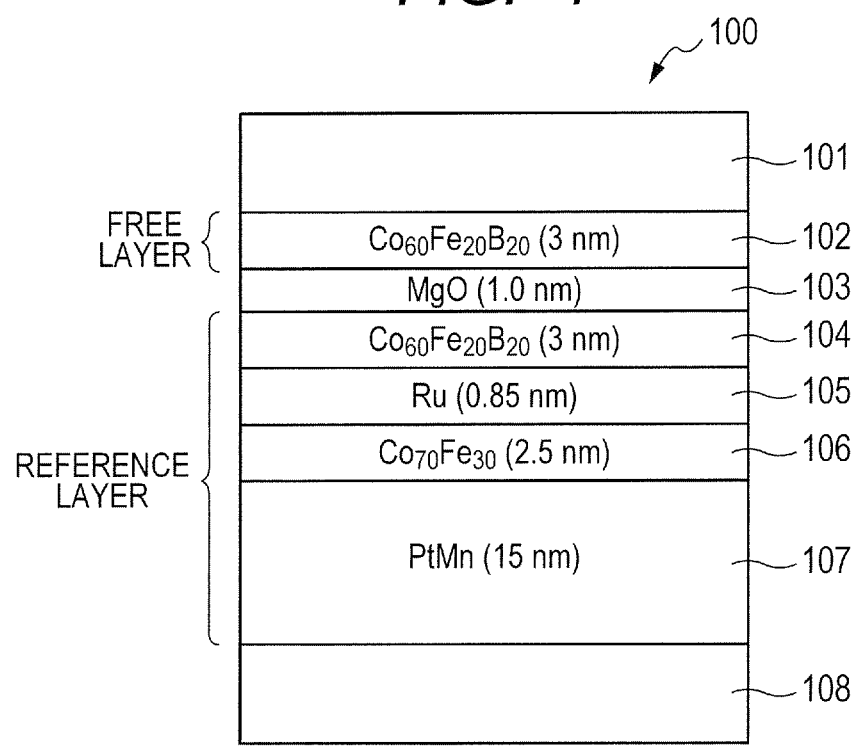
FIG. 1 is a schematic diagram of a multilayer structure of an in-plane magnetization type element as one example of an element which is applied to an oxidation process according to one embodiment of the present invention.

Although embodiments of the present invention will be described below with reference to the drawings, it is to be understood that the present invention is not limited to the embodiments. In the drawings described below, parts having the same functions are indicated by the same reference numerals, and repeated description of the parts may be omitted.

As a result of intense studies in order to solve the foregoing problems, the inventors have found out that an oxidation process for forming the complicated tunnel magnetoresistive element structures disclosed in Non Patent Documents 1, 2, 3 is performed in a short time thereby to enable making a RA distribution uniform, while suppressing a reduction in throughput. Specifically, it is preferable that the time for processing by one oxidation process apparatus be equal to or shorter than about 2 minutes. Also, an oxidation process apparatus according to one embodiment of the present invention suppresses adsorption of impurities on an interface due to deterioration in the degree of vacuum, and thus can keep an ultrahigh vacuum. Thus, the inventors have found out that a tunnel magnetoresistive element can be manufactured, while performing the oxidation process on a film to contribute to element characteristics, in particular, suppressing the adsorption of impurities, reducing the occurrence of crystal defects or characteristic deterioration in a metal multilayer film structure. Also, the oxidation process apparatus according to one embodiment of the present invention can reduce a surface area of a wall partitioning an oxidation process space (or a space in which the oxidation is performed on a substrate), even if a processing chamber is not reduced in size. Therefore, the amount of oxygen adsorbed on the wall partitioning the oxidation process space can be reduced, and further, the oxidation process space in itself is reduced in size, and thus, a rise time until the oxidation process and the time required for finish the oxidation process can be reduced, and thus, a reduction in the throughput can be reduced.

In one embodiment of the present invention, in an oxidation process apparatus for performing an oxidation process on a substrate, a certain space smaller than a space partitioned by an inner wall of a processing chamber is formed in the processing chamber provided in the oxidation process apparatus, and the certain space is used as an oxidation process space (or a space in which the oxidation process is performed on the substrate). In one embodiment of the present invention, the oxidation process space is formed by a surrounding portion (or a partition portion for partitioning the oxidation process space) provided in the processing chamber and a substrate holder (specifically, a substrate holding surface, for example) provided in the processing chamber, and an oxygen gas for the oxidation process is introduced restrictively into the formed oxidation process space. Further, the surrounding portion is configured to, during formation of the oxidation process space, surround the substrate holding surface and form a gap between the surrounding portion and the substrate holder, and the oxygen gas introduced into the oxidation process space is evacuated from the oxidation process space through the gap.

In one embodiment of the present invention, such an oxidation method can be used to manufacture an electronic device (for example, a tunnel magnetoresistive element or the like).

FIG. 1 is a schematic diagram of a multilayer structure of an in-plane magnetization type element (hereinafter called an MTJ (Magnetic Tunnel Junction) element) disclosed in Non Patent Document 1. In an MTJ element 100, a compound containing tantalum (Ta) and copper (Cu), for example, is first stacked as a lower electrode layer 108 on top of a process substrate. The lower electrode layer 108 has a structure such for example as Ta (5 nm)/CuN (20 nm)/Ta (5 nm). Upper Ta also serves as an underlayer film, and, besides Ta, metal such as hafnium (Hf), niobium (Nb), zirconium (Zr), titanium (Ti), molybdenum (Mo), or tungsten (W) may be used. Further, a layer containing at least one element of nickel (Ni), iron (Fe), chromium (Cr), and ruthenium (Ru), for example, may be deposited on top of Ta or the like.

An antiferromagnetic layer 107 containing IrMn, PtMn, FeMn, NiMn, RuRhMn or CrPtMn or the like, for example, is deposited in a thickness on the order of 3 to 20 nm on top of the lower electrode layer 108. A reference layer 106, a non-magnetic intermediate layer 105, and a reference layer 104 are deposited on top of the antiferromagnetic layer 107. The reference layer 106 contains a magnetic film of CoFe or the like, for example, and has a thickness on the order of to 5 nm. The non-magnetic intermediate layer 105 contains at least one element selected from ruthenium (Ru), chromium (Cr), rhodium (Rh), iridium (Ir), and rhenium (Re), or an alloy of two or more of these metals, and has a thickness on the order of 0.85 nm. The reference layer 104 contains a magnetic film of CoFe or CoFeB or the like, for example, and has a thickness on the order of 1 to 5 nm. The antiferromagnetic layer 107, the pinned magnetic layer 106, the non-magnetic intermediate layer 105, and the pinned magnetic layer 104 form a reference layer of a synthetic type. This reference layer may be configured to have a double-layer structure of the antiferromagnetic layer and the reference layer 106. The reference layer is a layer in which a direction of magnetization is pinned.

A barrier layer 103 is formed on top of the reference layer 104. Preferably, the barrier layer 103 is made of MgO in order to obtain a high MR ratio. Besides MgO, an oxide containing at least one or two or more of magnesium (Mg), aluminum (Al), titanium (Ti), zinc (Zn), hafnium (Hf), germanium (Ge), and silicon (Si) may be used. Any of a method using RF sputtering or the like to directly form the oxide, and a method which involves depositing metal and then oxidizing the metal may be used. Oxidation is performed by flow oxidation while seal oxidizing and evacuating a chamber, radical oxidation or plasma oxidation utilizing active oxygen, or the like. A free layer 102 having a structure formed of one layer or two or more layers of a material containing CoFeB or an alloy of at least one or two or more of Co, Fe, Ni or the like is deposited in a thickness on the order of 1 to 10 nm on top of the barrier layer 103. The free layer is a layer in which magnetization is not pinned, and changes resistance according to a relative angle with respect to magnetization of the reference layer. A multilayer structure such for example as Ta (8 nm)/Ru (5 nm)/Cu (30 nm)/Ru (7 nm) is deposited as an upper electrode layer 101 on top of the free layer 102. This layer has the function of protecting the element, and a Ta portion may be replaced by a material such for example as ruthenium (Ru), titanium (Ti), or platinum (Pt). Such a TMR element is fabricated in vacuum by a substrate processing device of a cluster type.

In FIG. 1, the antiferromagnetic layer 107 is made of PtMn of 15 nm thick; the reference layer 106, $Co_{70}Fe_{30}$ of 2.5 nm thick; the non-magnetic intermediate layer 105, Ru of 0.85 nm thick; the reference layer 104, $Co_{60}Fe_{20}B_{20}$ of 3 nm thick; the barrier layer 103, MgO of 1.0 nm thick; and the free layer 102, $Co_{60}Fe_{20}B_{20}$ of 3 nm thick.

Figure 2:
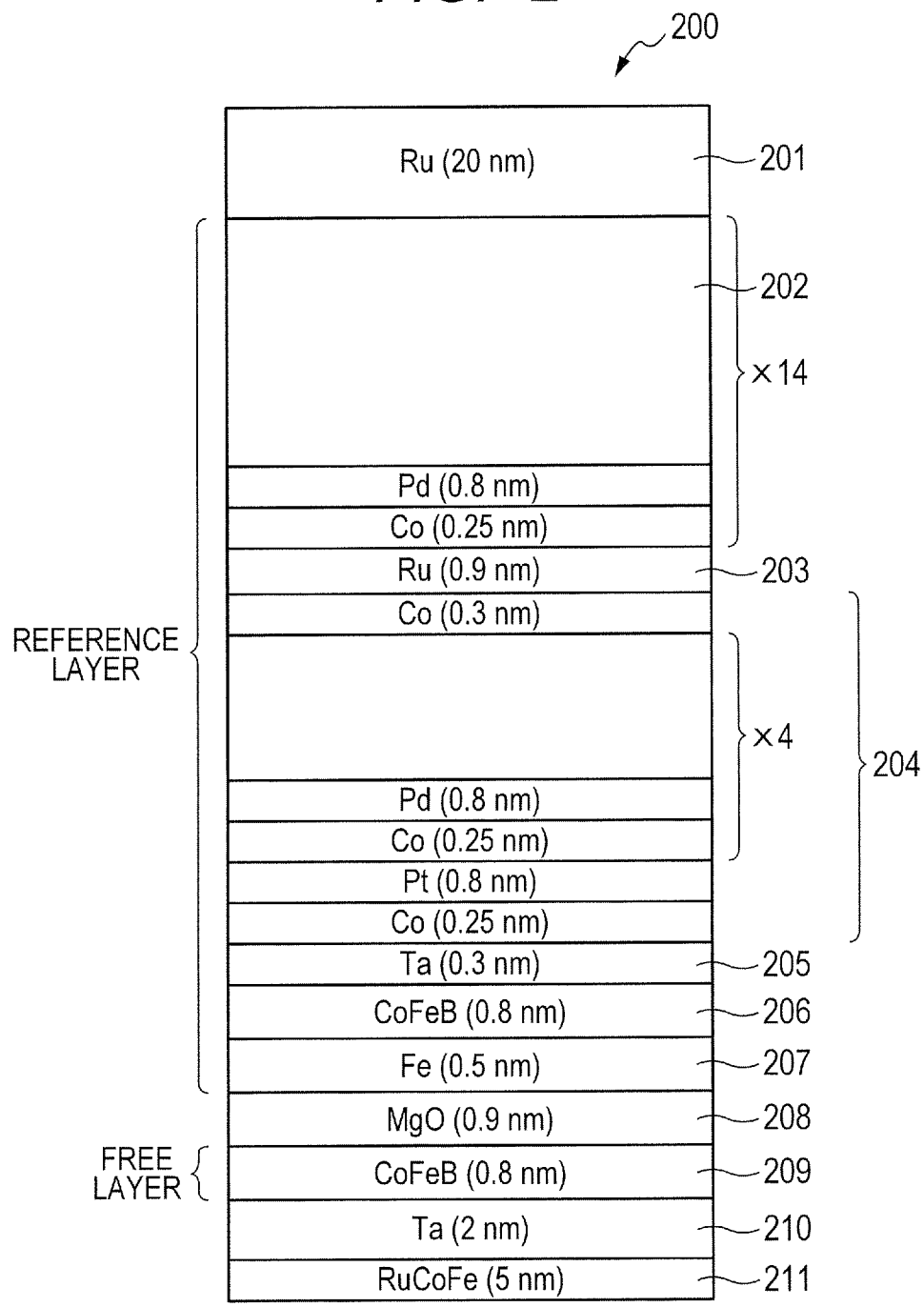
FIG. 2 is a schematic diagram of a multilayer structure of a perpendicular magnetization type element as one example of an element which is applied to an oxidation process according to one embodiment of the present invention.

FIG. 2 is a schematic diagram of a multilayer structure of a perpendicular magnetization type element (hereinafter called a p-MTJ element) disclosed in Non Patent Document 2. In a p-MTJ element 200, buffer layers 211, 210 are first stacked on top of a substrate. For example, a material containing at least one element of nickel (Ni), iron (Fe), chromium (Cr), and ruthenium (Ru) is used for the buffer layer 211. Also, metal such as tantalum (Ta), hafnium (Hf), niobium (Nb), zirconium (Zr), titanium (Ti), molybdenum (Mo), or tungsten (W) may be used for the buffer layer 210, and besides these, an oxide containing at least one or two or more of magnesium (Mg), aluminum (Al), tantalum (Ta), titanium (Ti), zinc (Zn), hafnium (Hf), germanium (Ge), and silicon (Si) may be used.

CoFeB, for example, is deposited as a free layer 209 on top of the buffer layer 210. Further, an alloy of at least one or two or more of Co and Fe may be disposed between CoFeB and MgO. A total film thickness of a CoFeB or CoFeB/CoFe magnetic layer is of the order of 0.8 to 2.0 nm. A barrier layer 208 is formed on top of the free layer 209. Preferably, the barrier layer is made of MgO in order to obtain a high MR ratio. Besides MgO, an oxide containing at least one or two or more of magnesium (Mg), aluminum (Al), titanium (Ti), zinc (Zn), hafnium (Hf), germanium (Ge), and silicon (Si) may be used. Any of a method using RF sputtering or the like to directly form the oxide, and a method which involves depositing metal and then oxidizing the metal may be used. Oxidation is performed by flow oxidation while seal oxidizing and evacuating a chamber, radical oxidation or plasma oxidation utilizing active oxygen, or the like.

A reference layer 207 containing CoFe or the like and having a thickness on the order of 0.2 to 1 nm, a reference layer 206 containing CoFeB or the like and having a thickness on the order of 0.5 to 2.0 nm, an orientation separation layer 205 containing Ta or the like, and a reference layer 204 for imparting perpendicular magnetic anisotropy to the reference layer 206 and the reference layer 207 are deposited on top of the barrier layer 208. In FIG. 2, the two reference layers are each illustrated by way of example as having a multilayer structure of Co/Pd; however, besides this, any form of a multilayer structure such as Co/Pd, Co/Pt, or Co/Ni, an amorphous material such as TbTeCo or GdFeCo, and a regular alloy such as FePt, CoPt, MnGa, or MnAl may be used. Also, a form may be used in which the reference layer 207 is omitted so that CoFeB of the reference layer 206 is in direct contact with the barrier layer 208. Further, the orientation separation layer 205 may be made of, besides Ta, an alloy of at least one or two or more of tantalum (Ta), hafnium (Hf), niobium (Nb), zirconium (Zr), titanium (Ti), molybdenum (Mo), tungsten (W), platinum (Pt), and ruthenium (Ru), or an oxide containing at least one or two or more of magnesium (Mg), aluminum (Al), tantalum (Ta), titanium (Ti), zinc (Zn), hafnium (Hf), germanium (Ge), and silicon (Si).

A non-magnetic intermediate layer 203 containing an alloy of at least one or two or more of ruthenium (Ru), chromium (Cr), rhodium (Rh), iridium (Ir), and rhenium (Re), and having a thickness on the order of 0.8 nm is formed on top of the reference layer 204. A reference layer 202 constructed of a multilayer structure such as Co/Pd, Co/Pt, or Co/Ni, an amorphous material such as TbTeCo or GdFeCo, and a regular alloy such as FePt, CoPt, MnGa, or MnAl is formed on top of the non-magnetic intermediate layer 203. The reference layer 207, the reference layer 206, the orientation separation layer 205, a multilayer structure portion of the reference layer 204, the non-magnetic intermediate layer 203, and the reference layer 202 form a reference layer of a synthetic type. This reference layer may have a structure in which the non-magnetic intermediate layer 203 and the reference layer 202 are omitted and the reference layer 207, the reference layer 206, the orientation separation layer 205, and the reference layer 204 form the reference layer. Ta (5 nm) is formed as a cap layer 201 on top of the reference layer 202. Ta may be replaced by a material such for example as ruthenium (Ru), titanium (Ti), or platinum (Pt). Such a TMR element is fabricated in vacuum by a substrate processing device of a cluster type.

In FIG. 2, the buffer layer 211 is made of RuCofe of 5 nm thick; the buffer layer 210, Ta of 2 nm thick; the free layer 209, CoFeB of 0.8 nm thick; the barrier layer 208, MgO of 0.9 nm thick; the reference layer 207, Fe of 0.5 nm thick; the reference layer 206, CoFeB of 0.8 nm thick; the orientation separation layer 205, Ta of 0.3 nm thick; and the reference layer 204 has a structure including four stacks each having Co of 0.25 nm thick and Pt of 0.8 nm thick. The non-magnetic intermediate layer 203 is made of Ru of 0.9 nm thick, the reference layer 202 has a structure including fourteen stacks each having Co of 0.25 nm thick and Pt of 0.8 nm thick, and the cap layer 201 is made of Ru of 20 nm thick.

Figure 3:
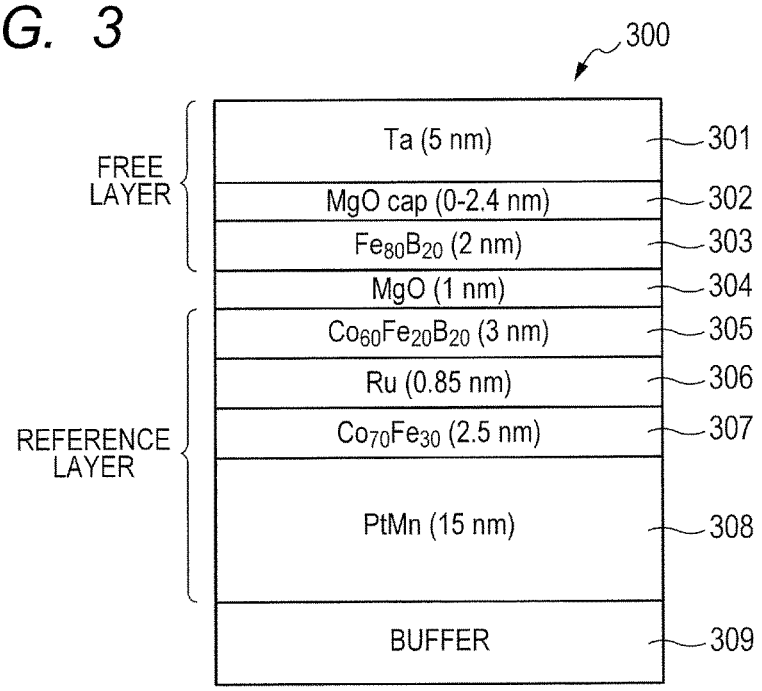
FIG. 3 is a schematic diagram of a multilayer structure of an in-plane magnetization type element as one example of an element which is applied to an oxidation process according to one embodiment of the present invention.

FIG. 3 is a schematic diagram of a multilayer structure of an in-plane magnetization type element (hereinafter called an MTJ element) disclosed in Non Patent Document 3. In an MTJ element 300, Ta (5 nm), for example, is first deposited as a buffer layer 309 on top of a process substrate. Upper Ta also serves as an underlayer film, and, besides Ta, metal such as hafnium (Hf), niobium (Nb), zirconium (Zr), titanium (Ti), molybdenum (Mo), or tungsten (W) may be used. Further, a layer containing at least one element of nickel (Ni), iron (Fe), chromium (Cr), and ruthenium (Ru) and the like, for example, may be deposited on top of Ta or the like. An antiferromagnetic layer 308 containing IrMn, PtMn, FeMn, NiMn, RuRhMn or CrPtMn or the like, for example, is deposited in a thickness on the order of 3 to 20 nm on top of the buffer layer 309. A reference layer 307, a non-magnetic intermediate layer 306, and a reference layer 305 are deposited on top of the antiferromagnetic layer 308. The reference layer 307 contains CoFe or the like, for example, and has a thickness on the order of 1 to 5 nm. The non-magnetic intermediate layer 306 contains an alloy of at least one or two or more of ruthenium (Ru), chromium (Cr), rhodium (Rh), iridium (Ir), and rhenium (Re), and has a thickness on the order of 0.8 nm. The reference layer 305 contains CoFe or CoFeB or the like, for example, and has a thickness on the order of 1 to 5 nm. The antiferromagnetic layer 308, the pinned magnetic layer 307, the non-magnetic intermediate layer 306, and the pinned magnetic layer 305 form a reference layer of a synthetic type. This reference layer may be configured to have a double-layer structure of the antiferromagnetic layer and the two reference layers. The reference layer is a layer in which a direction of magnetization is pinned.

A barrier layer 304 is formed on top of the reference layer 305. Preferably, the barrier layer 304 is made of MgO in order to obtain a high MR ratio. Besides MgO, an oxide containing at least one or two or more of magnesium (Mg), aluminum (Al), titanium (Ti), zinc (Zn), hafnium (Hf), germanium (Ge), and silicon (Si) may be used. Any of a method using RF sputtering or the like to directly form the oxide, and a method which involves depositing metal and then oxidizing the metal may be used. Oxidation is performed by flow oxidation while seal oxidizing and evacuating a chamber, radical oxidation or plasma oxidation utilizing active oxygen, or the like. A free layer 303 having a structure formed of one layer or two or more layers of a material containing CoFeB or an alloy of at least one or two or more of Co, Fe, Ni or the like, for example, is deposited in a thickness on the order of 1 to 10 nm on top of the barrier layer 304. The free layer 303 is a layer in which magnetization is not pinned, and changes resistance according to a relative angle with respect to magnetization of the reference layer.

An oxide cap layer 302 is formed on top of the free layer 303. The oxide cap layer 302 has the effect of reducing a critical current density Jc0 for reversal of magnetization, by allowing spin torque to provide easier reversal of magnetization by imparting perpendicular magnetic anisotropy to magnetization of the free layer. An oxide containing at least one or two or more of magnesium (Mg), aluminum (Al), titanium (Ti), zinc (Zn), hafnium (Hf), germanium (Ge), and silicon (Si), or the like can be applied to the oxide cap layer. Oxidation is performed by flow oxidation while seal oxidizing and evacuating a chamber, radical oxidation or plasma oxidation utilizing active oxygen, or the like. Ta (5 nm) is formed as a cap layer 301 on top of the oxide cap layer 302. Ta may be replaced by a material such for example as ruthenium (Ru), titanium (Ti), or platinum (Pt). Such a TMR element is fabricated in vacuum by a substrate processing device of a cluster type.

In FIG. 3, the antiferromagnetic layer 308 is made of PtMn of 15 nm thick; the reference layer 307, $Co_{70}Fe_{30}$ of 2.5 nm thick; the non-magnetic intermediate layer 306, Ru of 0.85 nm thick; the reference layer 305, $Co_{60}Fe_{20}B_{20}$ of 3 nm thick; the barrier layer 304, MgO of 1 nm thick; the free layer 303, $Fe_{80}B_{20}$ of 2 nm thick; the oxide cap layer 302, an MgO cap of 0 to 2.4 nm thick; and the cap layer 301, Ta of 5 nm thick.

First Embodiment

Figure 4:
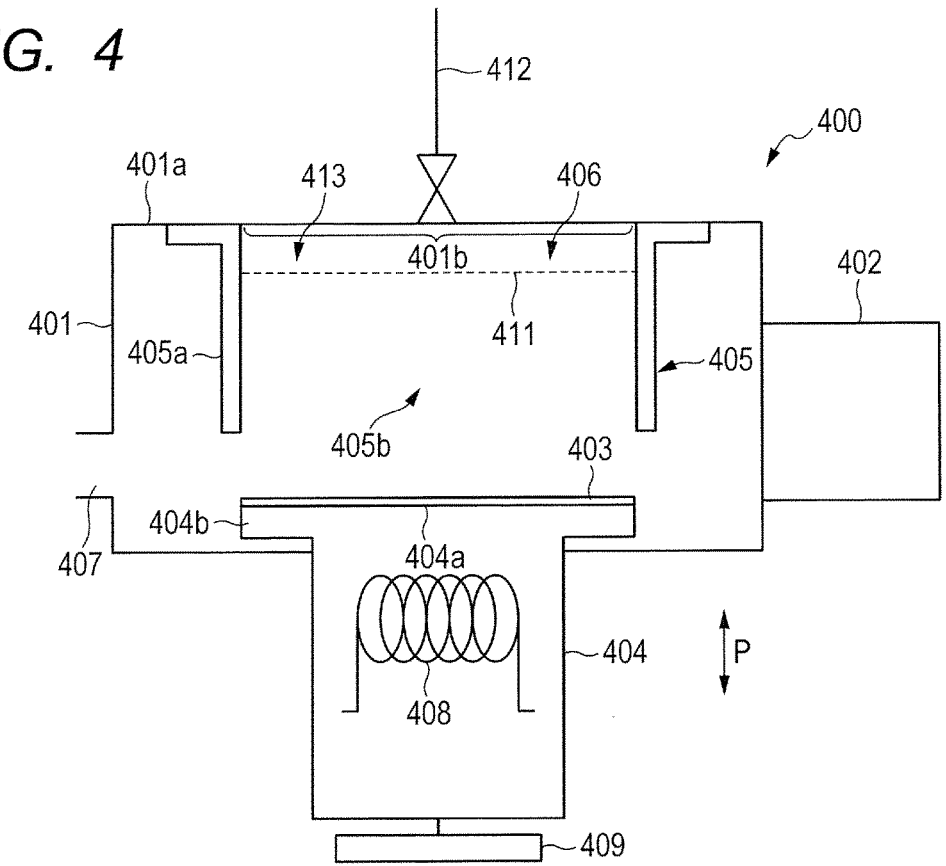
FIG. 4 is a schematic diagram illustrating a general configuration of an oxidation process apparatus according to one embodiment of the present invention, under a substrate transport condition.
Figure 5:
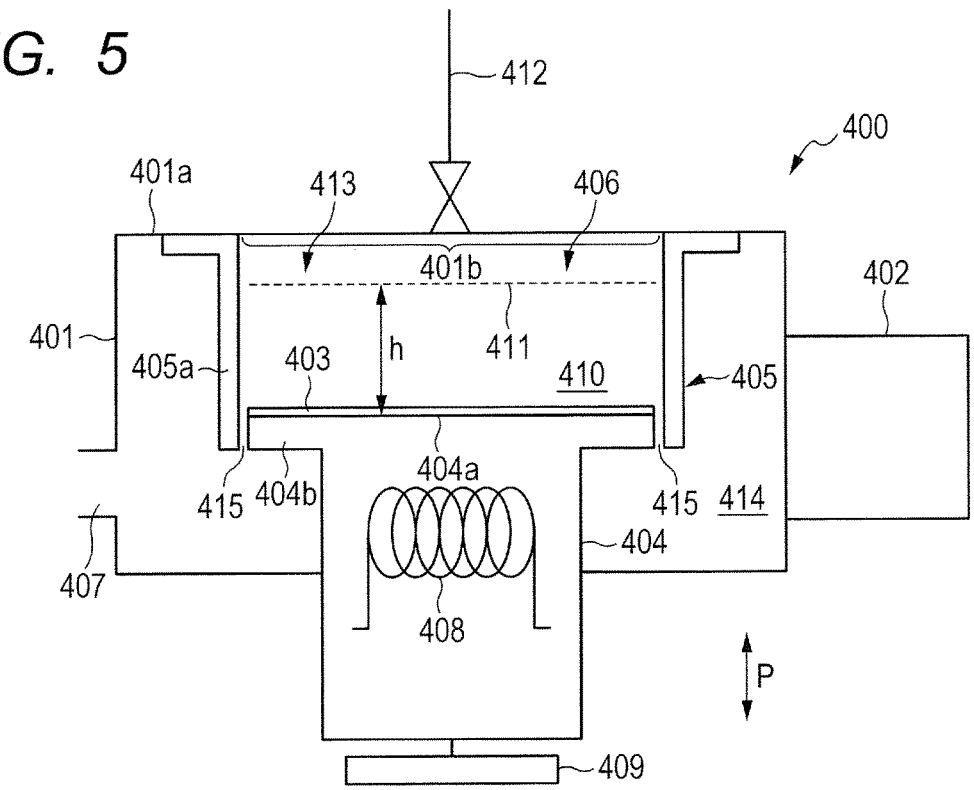
FIG. 5 is a schematic diagram illustrating the general configuration of the oxidation process apparatus according to one embodiment of the present invention, under an oxidation process condition.

FIG. 4 is a schematic diagram illustrating a configuration of an oxidation process apparatus 400 according to the embodiment, under a substrate transport condition. FIG. 5 is a schematic diagram illustrating the configuration of the oxidation process apparatus 400 according to the embodiment, under an oxidation process condition. In the embodiment, the oxidation process apparatus 400 forms a barrier layer of each element illustrated by way of example in FIGS. 1 to 3. In the embodiment, the barrier layer is made of MgO, and a substrate having Mg formed thereon is subjected to an oxidation process in the oxidation process apparatus 400 thereby to form MgO.

In FIGS. 4 and 5, the oxidation process apparatus 400 includes a processing chamber 401, a vacuum pump 402 as an evacuation unit for evacuating the processing chamber, a substrate holder 404 configured to hold a substrate 403 placed in the processing chamber 401, a cylindrical member 405 disposed in the processing chamber 401 and configured to form part of a surrounding portion, a gas introduction unit 406 as an oxygen gas introduction means for introducing an oxygen gas into the processing chamber 401, and a substrate transport port 407. The substrate transport port 407 is provided with a slit valve (not illustrated).

The oxidation process apparatus 400 may be further provided with a heating device (not illustrated) disposed external to the processing chamber 401. Although the heating device such as a heater is disposed in the processing chamber 401 thereby to enable removing moisture adsorbed on internal components of the oxidation process apparatus 400, an externally heating structure is further provided thereby to enable heating the whole of the oxidation process apparatus 400. Preferably, impurities in the oxidation process apparatus are suppressed and a highly clean gas is introduced into the apparatus in ultrahigh vacuum, in order to improve the RA distribution by the oxidation process for generation of the barrier layer. For this, the use of the externally disposed heating device enables improving the degree of vacuum in the oxidation process apparatus 400 and hence reducing the presence of impurities, and thus enables performing the oxidation process by purity of the introduced gas.

The substrate holder 404 includes a substrate holding surface 404a configured to hold the substrate 403, and a placement portion 404b on which the substrate holding surface 404a is formed, and the substrate 403 is mounted on the substrate holding surface 404a. Also, a heater 408 as the heating device is provided in the substrate holder 404. Also, a substrate holder drive unit 409 as a position changing means for changing relative positions of the substrate holder 404 and the cylindrical member 405 is connected to the substrate holder 404. The substrate holder drive unit 409 moves the substrate holder 404 in directions of arrows P (or a direction in which the substrate holder 404 is moved closer to an oxidation process space 410, and a direction in which the substrate holder 404 is moved away from the oxidation process space 410).

Preferably, the substrate holder 404 includes an overhang region overhanging in a direction perpendicular to the direction of movement, and a distance between the overhang region and the cylindrical member 405 which forms part of the surrounding portion is set equal to or less than 3 mm. The overhang region has a predetermined thickness in the direction of movement. Preferably, during execution of the oxidation process, the oxygen gas is introduced into the oxidation process space 410 in a state where the substrate holder 404 is housed in the cylindrical member 405 (or in a space surrounded by the cylindrical member 405) by at least the predetermined thickness.

In the embodiment, during substrate transport, under control of the substrate holder drive unit 409, the substrate holder 404 is moved to a position illustrated in FIG. 4. During carrying-in of the substrate, under this condition, the substrate 403 is transported through the substrate transport port 407 into the processing chamber 401, and the substrate 403 is mounted on the substrate holding surface 404a. During carrying-out of the substrate, the substrate 403 held on the substrate holding surface 404a is transported through the substrate transport port 407 out of the processing chamber 401. Meanwhile, in the oxidation process, under control of the substrate holder drive unit 409, the substrate holder 404 is moved to a position illustrated in FIG. 5. Under this condition, the gas introduction unit 406 introduces the oxygen gas restrictively into the oxidation process space 410 (or introduces the oxygen gas restrictively into one space in the processing chamber 401) thereby to perform the oxidation process.

In the oxidation process apparatus 400 according to the illustrated embodiment, the cylindrical member 405 which forms part of the surrounding portion is disposed in an upper portion in the processing chamber 401, and the substrate transport port 407 for the substrate 403 is disposed in a side portion of the processing chamber. Then, a tip of an extending portion of the cylindrical member 405 is located at a height position in the vicinity of an upper end of the substrate transport port 407. Such an arrangement enables reducing a distance traveled by the substrate 403 and thus suppressing unnecessary oxidation in stages in course of transport and also achieving size reduction in the oxidation process apparatus 400.

Moreover, in the embodiment, the provision of the heater 408 enables an oxidation step to perform the oxidation process while heating the substrate 403. Therefore, even if an oxidation process object is a thick film or an oxidation-resistant material, the use of thermal energy applied by the heater 408 enables accelerating an oxidation reaction.

The gas introduction unit 406 is disposed apart from a wall 401a of the processing chamber 401 facing the substrate holder 404, and includes a shower plate 411 having many holes, an oxygen introduction path 412 disposed in the wall 401a and having a gas introduction port for introducing the oxygen gas into the processing chamber 401, and a diffusion space (gas diffusion space) 413 forming a space between the shower plate 411 and the wall 401a, and configured to diffuse the oxygen gas introduced through the oxygen introduction path 412. In the embodiment, the oxygen introduction path 412 is disposed so that the oxygen gas is introduced into the diffusion space 413, and the oxygen gas introduced through the oxygen introduction path 412 and diffused in the diffusion space 413 is uniformly supplied through the shower plate 411 into a substrate surface. Plural oxygen introduction paths 412 may be provided.

The cylindrical member 405 is a member having the extending portion 405a extending from the wall 401a (or a gas introduction portion side) toward a side facing the wall 401a (here, a substrate holder 404 side), the extending portion 405a being mounted to the wall 401a so as to surround wholly the shower plate 411 and a region 401b including at least a portion of the wall 401a of the processing chamber 401, to which the oxygen introduction path 412 is connected. In the embodiment, the cylindrical member 405 is a cylindrical member which is circular in a cross section taken perpendicularly to an extending direction; however, the cross section may have other shapes such as a polygonal shape. Also, the cylindrical member 405 is made of aluminum, for example. Aluminum is preferable because the cylindrical member 405 can be easily worked. Also, besides, the cylindrical member 405 may be made of titanium or stainless steel (SUS), for example. Also, the cylindrical member 405 may be configured to be attachable to and detachable from the wall 401a. The shower plate 411 is disposed in a space surrounded by the extending portion 405a, or equivalently, a hollow portion of the cylindrical member 405, and a portion of the cylindrical member 405 closer to the wall 401a than the shower plate 411, at least a portion of the wall 401a in the region 401b, and the shower plate 411 form the diffusion space 413.

It is necessary to make more uniform an oxygen pressure on a surface of Mg as an oxidation object, in order to improve an oxidation distribution of MgO and thus improve an in-plane RA distribution of MgO formed by the oxidation process. For example, in a case of a highly reactive material such as Mg, it is known that this pressure gradient causes degradation in the oxidation distribution. Therefore, a structure provided with the shower plate 411 is preferable. A structure further provided with the cylindrical member 405 is preferable. Specifically, the provision of the shower plate 411 and the cylindrical member 405 enables uniformly supplying the oxygen gas to the surface of the substrate 403 in a position illustrated in FIG. 5 and thus enables reducing unevenness of oxidation distribution of MgO produced by oxidation in the surface of the substrate 403, even if the oxygen introduction path 412 is not coaxial with the vacuum pump 402 as the evacuation unit (for example, in a case where an oxygen introduction direction of the oxygen introduction path 412 is perpendicular to an evacuation direction of the vacuum pump 402, as illustrated in FIGS. 4 and 5). Therefore, the RA distribution can be improved.

The oxygen gas is introduced through the holes of the shower plate 411 into the oxidation process space 410, and thus, the shower plate 411 can be said to be a region (also called an "oxygen gas introduction region") of the gas introduction unit 406, in which a portion for limited introduction of the oxygen gas into the oxidation process space is provided.

In a case where the shower plate 411 is not provided by way of example, the oxygen gas is introduced through the oxygen introduction path 412 into the oxidation process space 410, and thus, the region 401b forms the oxygen gas introduction region.

In the embodiment, the oxygen gas introduction region, the cylindrical member 405, and the substrate holder 404 (or the substrate holding surface 404a) can be said to form the oxidation process space 410.

Also, the cylindrical member 405 is disposed so as to form a gap 415 between the extending portion 405a and at least a portion (or the placement portion 404b) of the substrate holder 404, when the substrate holder 404 is inserted in an opening 405b of the cylindrical member 405, as illustrated in FIG. 5. Specifically, the cylindrical member 405 is configured to, during formation in the oxidation process space 410, provide the gap 415 between the extending portion 405a and the placement portion 404b surrounding the substrate holder 404 and having the substrate holding surface 404a formed thereon. Therefore, the oxygen gas introduced from the gas introduction unit 406 into the oxidation process space 410 is evacuated through the gap 415 from the oxidation process space 410 into an external space 414 of the oxidation process space 410. The oxygen gas evacuated from the oxidation process space 410 through the gap 415 into the external space 414 is evacuated from the processing chamber 401 by the vacuum pump 402.

The substrate holder drive unit 409 moves the substrate holder 404 in the direction of the arrow P so that the substrate holding surface 404a is housed in the cylindrical member 405, and stops movement of the substrate holder 404 at a predetermined position in which the substrate holding surface 404a (or the placement portion 404b) is inserted in the opening 405b. Thus, as illustrated in FIG. 5, the oxidation process space 410 which communicates with the external space 414 only through the gap 415 is formed. At this time, the oxidation process space 410 is formed of the shower plate 411, the extending portion 405a, and the substrate holder 404 (or the substrate holding surface 404a). As illustrated in FIG. 5, the shower plate 411 and the substrate holding surface 404a are arranged facing each other, and the shower plate 411 and the substrate holding surface 404a are spaced apart by a distance h.

In the embodiment, therefore, the surrounding portion of the present invention is the shower plate 411, and the extending portion 405a of the cylindrical member 405. Therefore, the cylindrical member 405 is a surrounding member for partitioning the oxidation process space 410 together with the shower plate 411 and the substrate holder 404 (or the substrate holding surface 404a) so that, during the oxidation process, the oxygen gas introduced by the gas introduction unit 406 is introduced restrictively into the oxidation process space 410 in the processing chamber 401.

As mentioned above, in a case where the shower plate 411 is not provided by way of example, the oxidation process space 410 is formed of the region 401b, the extending portion 405a, and the substrate holder 404, and thus, in this case, the surrounding portion of the present invention is the region 401b which is a portion of the inner wall of the processing chamber 401, and the extending portion 405a of the cylindrical member 405.

In the embodiment, it is important that the substrate holder drive unit 409 change the relative positions of the substrate holder 404 and the cylindrical member 405 to enable forming the oxidation process space 410, and thus, the substrate holder drive unit 409 is configured to be capable of moving the substrate holder 404 in the direction of the arrow P, which is a uniaxial direction. However, the substrate holder drive unit 409 is not limited to this configuration, and any configuration may be adopted, provided that at least during the oxidation process, the substrate holding surface 404a is located in the cylindrical member 405 to allow forming the oxidation process space 410 and at other times (for example, during the substrate transport), the substrate holding surface 404a can be located external to the cylindrical member 405. For example, a configuration may be adopted in which the substrate holder 404 is fixed, the cylindrical member 405 and the gas introduction unit 406 are configured as a unit, and in the unit, the cylindrical member 405 and the gas introduction unit 406 configured as the unit are moved closer to the substrate holder 404 thereby to form the oxidation process space 410. Alternatively, a configuration may be adopted in which the substrate holder 404 is configured to be capable of sliding movement in both leftward and rightward directions in FIGS. 4 and 5, and at times other than the time of formation of the oxidation process space 410, the substrate holder 404 is moved to a position not facing the opening 405b.

In the oxidation process apparatus 400 according to the embodiment, it is preferable that the volume of the oxidation process space 410 be set within a range of 0.0042 m$^3$ to 0.012 m$^3$, taking into account a uniform pressure distribution of the oxygen gas coming from the shower plate 411 and reaching the surface of the substrate 403. More preferably, the volume of the oxidation process space 410 is set within a range of 0.0047 m$^3$ to 0.0093 m$^3$. In this case, it is preferable that the distance h between the shower plate 411 and the substrate holding surface 404a be set within a range of 0.042 m to 0.12 m. More preferably, the distance h is set within a range of 0.047 m to 0.093 m.

Also, the substrate holder drive unit 409 may be configured so that the substrate holding surface 404a is rotatable in an in-plane direction of the substrate holding surface 404a. In other words, the substrate holder 404 may be configured so that the substrate holding surface 404a rotates about a direction of a normal to the substrate holding surface 404a.

Preferably, an oxygen pressure is made uniform on the surface of the substrate 403, in order to improve the oxygen distribution and thus improve the RA distribution. Therefore, even if gas introduction from the shower plate 411 is not uniform, the substrate holding surface 404a is rotated thereby to rotate the substrate 403, and thus, a gas concentration distribution of the oxygen gas supplied to the surface of the substrate 403 can be made uniform. Therefore, the RA distribution can be improved.

In the embodiment, the shape of the substrate holding surface 404a is circular, and the cross section of the cylindrical member 405, taken perpendicularly to the extending direction of the extending portion 405a, has a similar shape to the external shape of the substrate holding surface 404a (or the placement portion 404b). In other words, the above-described cross section is circular. Also, during the formation of the oxidation process space 410, the shower plate 411 and the substrate holding surface 404a face each other, and the gap 415 also faces the shower plate 411. In this case, it is preferable that the size of the gap 415 be set equal in a peripheral direction of the substrate holding surface 404a. By such a configuration, evacuation conductance can be set to the same value in the whole of the gap 415 formed in the peripheral direction of the substrate holding surface 404a. In other words, uniform evacuation can take place in the entire periphery of the gap 415 which functions as an exhaust port from the oxidation process space 410. Therefore, during the formation of the oxidation process space 410, the oxygen pressure on the surface of the substrate 403 mounted on the substrate holder 404 can be made uniform, and thus, the RA distribution can be improved.

Also, in the embodiment, the substrate holder drive unit 409 is configured to move the substrate holder 404 along the extending direction of the extending portion 405a in the cylindrical member 405. In other words, the substrate holder drive unit 409 can move the substrate holder 404, in the cylindrical member 405, in a direction in which the substrate holder 404 is moved closer to the shower plate 411 as the oxygen gas introduction region, and in a direction in which the substrate holder 404 is moved away from the shower plate 411.

Figure 6:
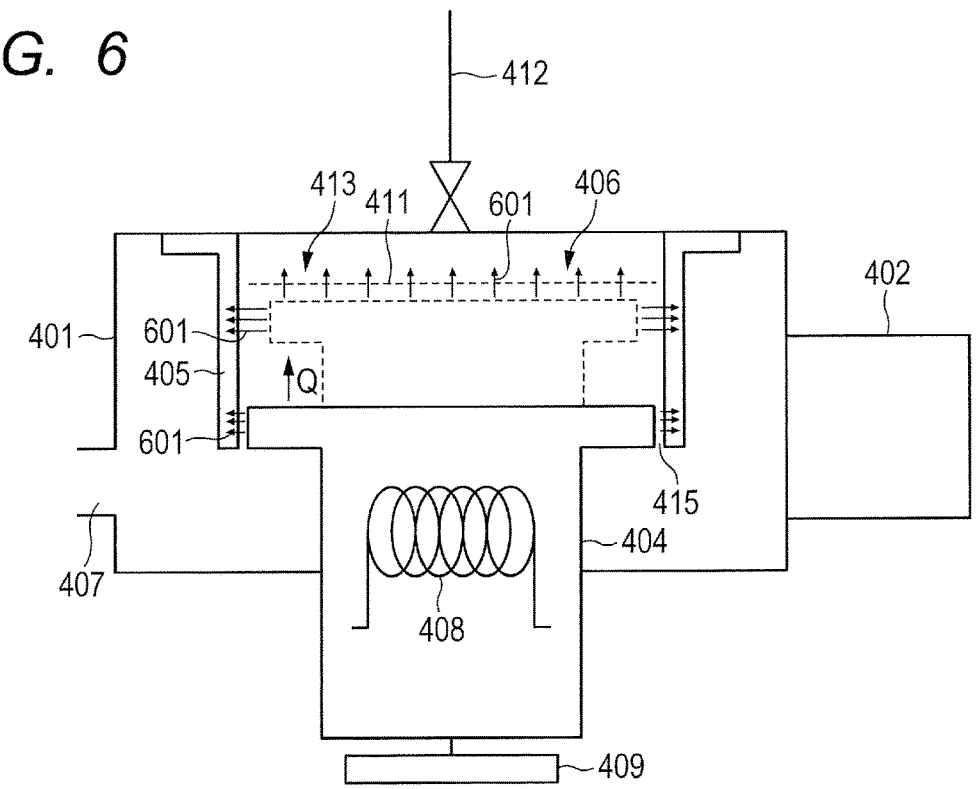
FIG. 6 is a diagram illustrating a condition where a substrate holder according to one embodiment of the present invention is moved to heat a surrounding portion.

In order to improve the oxygen distribution and thus improve the RA distribution, it is preferable that the process surface of the substrate be exposed to a highly clean oxygen gas, and desirably, impurities such as moisture in the oxidation process apparatus are suppressed, and a highly clean oxygen gas is introduced into the oxidation process apparatus in ultrahigh vacuum to perform the oxidation process. Meanwhile, in the embodiment, as illustrated in FIG. 6, the substrate holder 404 with the heater 408 driven can be moved in the oxidation process space 410 along the extending direction of the extending portion 405a, and thus, even if an additional heating device for heating the cylindrical member 405 is not provided, a heating effect by the heater 408 can be imparted to the extending portion 405a. Specifically, the substrate holder 404 heated by the heater 408 is moved in the cylindrical member 405 along a direction of arrow Q, and thereby, heat 601 liberated from the substrate holder 404 by the heater 408 can be scanned on the extending portion 405a along the direction of arrow Q. Therefore, even if the heating device for heating the cylindrical member 405 is not provided, the cylindrical member 405 can be efficiently warmed by using the heat 601 from the substrate holder 404, and moisture or the like can be desorbed from the cylindrical member 405. Also, the above-described scanning enables uniformly heating the cylindrical member 405. Therefore, a highly pure oxygen atmosphere can be formed in the oxidation process space 410. Generally, moisture removal needs a heating temperature on the order of 120° C., and a structure capable of heating to a temperature close to this heating temperature is preferable.

Further, the cylindrical member 405 can be heated from its inside, and thus, the degree of vacuum in the oxidation process space 410 can be further improved. Also, if an incidence power density is the same, an inside surface temperature of the cylindrical member 405 is more easily increased by heating the cylindrical member 405 from its inside rather than by heating the cylindrical member 405 from its outside, and thus, the degree of vacuum can be more easily increased even if the heater 408 is low in power.

Moreover, in the embodiment, the placement portion 404b having the substrate holding surface 404a, which is a region of the substrate holder 404 in which the gap 415 is formed, is configured so that the gap 415 has the same size along the extending direction of the extending portion 405a. In other words, the substrate holder 404 and the cylindrical member 405 are configured so that a diameter of the cylindrical member 405 remains constant along the extending direction of the extending portion 405a, and that a diameter of the placement portion 404b also remains constant along the extending direction, and that the evacuation conductance of the gas from the oxidation process space 410 through the gap 415 does not change even if the placement portion 404b which is a portion of the substrate holder 404 closest to the extending portion 405a in the cylindrical member 405 is moved closer to and away from the shower plate 411. Therefore, even when the substrate holder 404 is moved in the cylindrical member 405, the oxygen gas can be evacuated from the oxidation process space 410 in the same manner, and thus, complexity of process control can be reduced.

Further, in the embodiment, it is preferable that an inner wall portion of the cylindrical member 405 be smoothed by being subjected for example to an electropolishing process or a chemical polishing process. In other words, in the embodiment, the inner wall of the cylindrical member 405 is flattened. Thus, surface roughness is reduced on the inner wall of the cylindrical member 405 thereby to enable reducing the adsorption of the oxygen gas on the inner wall of the cylindrical member 405 and the release of the oxygen gas adsorbed on the inner wall. It is also preferable that an inner wall surface of the cylindrical member 405 be coated with a film configured so as not to adsorb the oxygen gas thereon (for example, a passive state film such as an oxide film). Thus, the passive state film is formed on the inner wall surface of the cylindrical member 405 thereby to enable reducing the adsorption of oxygen on the inner wall surface. For example, when the cylindrical member 405 is made of aluminum and the above-described chemical polishing is performed on the inside of the cylindrical member 405, the inner wall surface of the cylindrical member 405 can be flattened and the oxide film can be formed. The adsorption of oxygen on the cylindrical member 405 can be reduced by the oxide film, as well as an effect of flattening.

Figure 7:
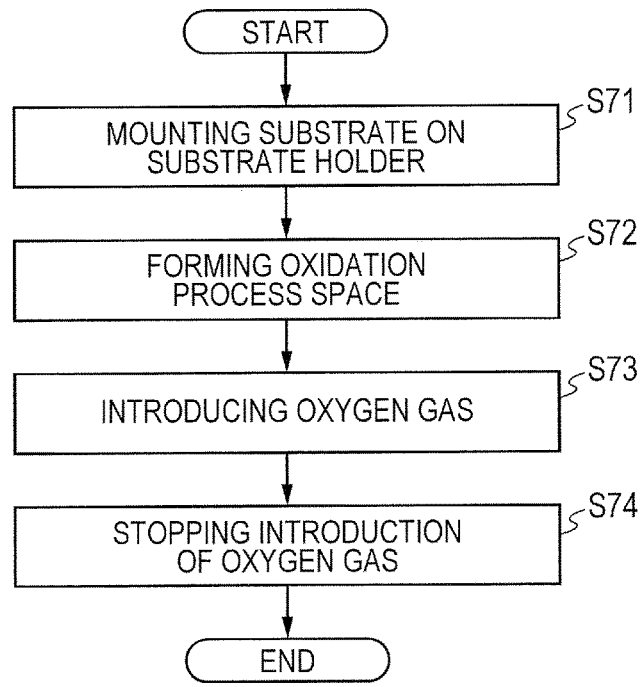
FIG. 7 is a flowchart illustrating a procedure for an oxidation process according to one embodiment of the present invention.

FIG. 7 is a flowchart illustrating an oxidation process according to the embodiment.

At step S71, the substrate 403 having Mg formed thereon is transported through the substrate transport port 407 into the processing chamber 401, and the substrate 403 is held on the substrate holding surface of the substrate holder 404 in a position illustrated in FIG. 4. At step S72, the substrate holder drive unit 409 is driven to move the substrate holder 404 to a position in which the oxidation process space 410 is formed as illustrated in FIG. 5. Thereby, the oxidation process space 410 as a smaller space than the processing chamber 401 is formed in the processing chamber 401. Then, at step S73, an oxygen gas is introduced restrictively into the smaller space thereby to perform an oxidation process on Mg formed on the substrate 403. At this time, as illustrated in FIG. 6, the oxidation process may be performed while the substrate holder 404 is moved in the cylindrical member 405. At step S74, the supply of the oxygen gas to the oxidation process space 410 formed at step S72 is stopped, and the oxidation process space 410 is evacuated to a predetermined pressure. In the embodiment, the vacuum pump 402 connected to the processing chamber 401 is always driven to always evacuate the processing chamber 401 in the above-mentioned steps S71 to S74. However, the driving of the vacuum pump 402 is not so limited, and the vacuum pump 402 may be limitedly driven according to each step.

First Example

Description will be given below with regard to Example in which the oxidation process apparatus 400 according to the embodiment is used to form the barrier layer 304 of the tunnel magnetoresistive element 300 disclosed in FIG. 3 and Non Patent Document 3. A substrate temperature can be appropriately determined within a range of 25° C. to 500° C.; an oxygen gas flow rate, 1 to 2000 sccm; a substrate rotation speed, 0 to 100 rpm; and a substrate position, 0 to 100 mm (here, a condition where the substrate is located in the opening 405b of cylindrical member 405 is set to 0 mm). An oxidation process is performed, for example under a condition where the substrate temperature is set to 25° C.; the oxygen flow rate, 700 sccm; the substrate rotation speed, 100 rpm; and the substrate position, 100 mm.

Second Example

In this Example, studies were made on tact time in a case where the conventional oxidation process apparatus not using the cylindrical member 405 was used to perform the oxidation process, and tact time in a case where the oxidation process apparatus 400 according to the embodiment was used to perform the oxidation process. Specifically, simulation was performed with regard to a difference in evacuation speed. Table 1 illustrates conditions and the evacuation speed under the conditions.

TABLE 1

Example
Prior art
Volume (m³)
(The volume of the cylindrical member 405)
(The volume of the processing chamber)

TABLE 1-continued

Process pressure (Pa)
Evacuation completion pressure (Pa)
Evacuation time (sec)

As can be seem from Table 1, comparison of the evacuation time between a pressure of 1 Pa and the completion of evacuation shows that Example is about 12 times faster than the conventional apparatus. In other words, Example can reduce the tact time, as compared to the conventional apparatus.

The conventional apparatus feeds the oxygen gas through the entire processing chamber to perform the oxidation process. Moreover, as a wafer size increases, the volume of the process apparatus also increases, and thus, the time required to evacuate the oxygen gas after the oxidation process has become long. Meanwhile, according to the embodiment, a smaller space (i.e. the oxidation process space 410) than the space partitioned by the inner wall of the processing chamber 401 is formed in the processing chamber 401, a portion which partitions the oxidation process space 410 is used as the substrate holding surface 404a, and the substrate 403 held on the substrate holding surface 404a is exposed to the oxidation process space 410. Then, the oxygen gas is supplied restrictively into the oxidation process space 410 to perform the oxidation process on the substrate 403. At this time, the oxidation process space 410 is evacuated through the gap 415 formed between the cylindrical member 405 and the substrate holder 404. Thus, in the embodiment, during the oxidation process, the oxygen gas is supplied only to a limited space (i.e. the oxidation process space 410) of the processing chamber 401 to perform the oxidation process, and thus, the time required for a space (the entire processing chamber in the conventional apparatus, and meanwhile, the oxidation process space 410 in the embodiment) filled with the oxygen gas for the oxidation process to reach a predetermined pressure can be reduced, and the time required for evacuation can also be reduced. Moreover, even if an increase in the wafer size causes an increase in the volume of the processing chamber, the oxidation process space 410 according to the embodiment is a smaller space than the processing chamber increased in volume. Therefore, the time required to evacuate the oxygen gas after the oxidation process can be reduced as compared to the conventional apparatus. Therefore, deterioration in throughput can be reduced.

Moreover, the smaller space (i.e. the oxidation process space 410) than the space partitioned by the inner wall of the processing chamber 401 is formed in the processing chamber 401 to perform the oxidation process in the smaller space, and thus, a surface area of a member which partitions a space in which the oxidation process is performed can be substantially reduced as compared to the conventional apparatus. Therefore, the amount of oxygen adsorbed on the cylindrical member 405 which forms the oxidation process space 410 in which the oxidation process is performed can be reduced, and after evacuation, the amount of oxygen released from the inner wall of the cylindrical member 405 can be substantially reduced. Therefore, during a certain oxidation process, unintended introduction of oxygen into the oxidation process space 410 (or the introduction of the released oxygen) can be reduced, and thus, deterioration in the MR ratio or the RA distribution can be suppressed. Further, variations in oxygen pressure from one oxidation process to another can be eliminated or reduced, which thus enables achieving stability of element characteristics such as the MR ratio or the RA distribution among fabricated elements.

For example, when MgO is used as the barrier layer, it is necessary to oxidize Mg. During the time required to reach the predetermined pressure for the oxidation process in the space in which the oxidation process is performed, the Mg surface is in contact with an impurity gas other than oxygen. Thus, unless the oxidation process is performed as soon as possible, this may lead to the deterioration in the element characteristics. Meanwhile, in the embodiment, the time during which the impurity gas is in contact with the Mg surface can be reduced, so that mixing of impurities into Mg can be reduced. Further, the Mg surface can be brought into contact with a pure oxygen gas under the predetermined pressure as soon as possible.

Further, in the processing chamber 401, the oxidation process space 410 is partitioned by using the cylindrical member 405 which is a separate member from the inner wall of the processing chamber 401, and thus, the shape of the oxidation process space 410 can be freely set. Therefore, a cross-sectional shape of the oxidation process space 410, taken parallel to the surface of the substrate 403 (or the substrate holding surface 404a), can be set similar to an external shape of the substrate 403 (or the substrate holding surface 404a). In the conventional apparatus, in a case where the processing chamber is cylindrical and the external shape of the substrate (or the substrate holding surface) is quadrangular, a cross section of the space in which the oxidation process is performed, taken parallel to the surface of the substrate (or the substrate holding surface), is circular and is different from the external shape of the substrate (or the substrate holding surface). Meanwhile, in the embodiment, for example, in a case where the processing chamber 401 is cylindrical and the external shape of the substrate 403 (or the substrate holding surface 404a) is quadrangular, the cylindrical member 405 whose cross section is quadrangular is mounted in the processing chamber 401, and thereby, the cross-sectional shape of the oxidation process space 410 can be set similar to the external shape of the substrate 403 (or the substrate holding surface 404a). Thus, when the cross-sectional shape of the oxidation process space 410 is set similar to the external shape of the substrate 403 (or the substrate holding surface 404a), the gap 415 can have the same width in the peripheral direction of the substrate 403 (or the substrate holding surface 404a), so that the evacuation conductance can become the same. Therefore, the oxidation distribution on the surface of the substrate 403 can be reduced.

Second Embodiment

In the second embodiment, the substrate holder 404 is provided with an electrostatic chuck (ESC), and further, a predetermined gas (a heating gas and/or a cooling gas) is supplied from an underside (or a substrate holding surface side) of the substrate 403.

Figure 8:
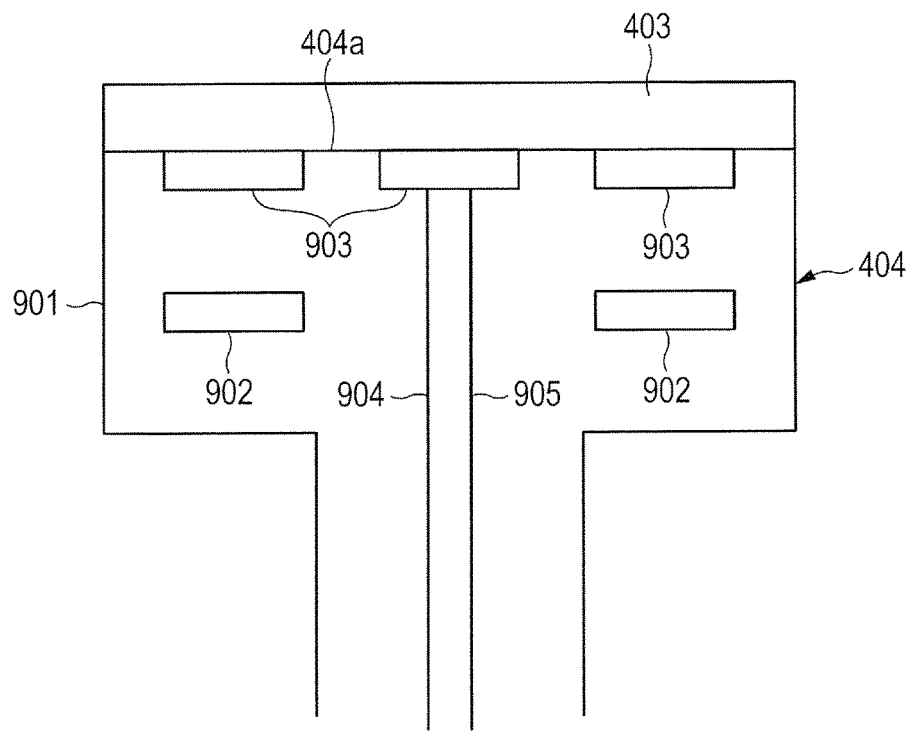
FIG. 8 is a schematic diagram illustrating a general configuration of the substrate holder according to one embodiment of the present invention.

FIG. 8 is a diagram illustrating the substrate holder 404 having ESC according to the second embodiment.

In FIG. 8, the substrate holder 404 includes a dielectric portion (or a base portion) 901 in which the substrate holding surface 404a is formed, an electrode 902 provided in the dielectric portion 901 and configured for electrostatic attachment of the substrate 403, a groove portion 903 formed in the substrate holding surface 404a, an introduction path 904 provided in the substrate holder 404 and configured to introduce the predetermined gas from the inside of the substrate holder 404 into the groove portion 903, and a discharge path 905 configured to discharge the predetermined gas from the groove portion 903 to the inside of the substrate holder 404. The predetermined gas introduced into the groove portion 903 through the introduction path 904 is at least one of the heating gas and the cooling gas. In the second embodiment, moreover, during the formation of the oxidation process space 410, an edge portion (or a side surface) of the dielectric portion 901 is located in proximity to the extending portion 405*a*. In other words, the gap 415 is formed between the edge portion (or the side surface) of the dielectric portion 901 and the extending portion 405*a*. In the second embodiment, the discharge path 905 is provided; however, it is not necessarily required that this path be provided. In this case, the predetermined gas supplied into the groove portion 903 is discharged through a gap formed between the substrate holding surface 404*a* and the substrate 403.

In the second embodiment, the groove portion 903 is provided in the substrate holding surface 404*a*, and thus, when the substrate 403 is mounted on the substrate holding surface 404*a*, a space (or an interface space as a second space) is formed by the substrate 403 and the groove portion 903. At least one of the heating gas and the cooling gas is introduced into the groove portion 903 through the introduction path 904, and thus, at least one of the heating gas and the cooling gas is supplied into the interface space.

It is known that when the substrate is heated and cooled, if the substrate is merely mounted on the substrate holder, heat conduction is poor and hence the time required to increase and decrease the substrate temperature becomes very long. Meanwhile, in the second embodiment, the substrate 403 can be electrostatically attached to the substrate holder 404, and thus, the time required to increase and decrease the substrate temperature can be reduced, and further, at least one of the heating gas and the cooling gas can be introduced, and thus, heat from the substrate holder 404 can be uniformly transferred to the substrate 403.

However, for example, when the substrate 403 is mounted on the substrate holding surface 404*a*, a gap is formed between the substrate holding surface 404*a* and the substrate 403, and thus, the predetermined gas supplied to the groove portion 903 leaks out through the gap. In the second embodiment, the gap 415 is formed in the edge portion of the substrate holding surface 404*a*, and thus, the predetermined gas leaking through the above-described gap is evacuated into the external space 414 through the gap 415 by a flow of gas evacuated through the gap 415. Therefore, the gas leaking from the groove portion 903 (or the interface space) can be prevented from entering into the oxidation process space 410, or the entry of the gas can be reduced. Desirably, the oxygen pressure is made uniform on the surface of the substrate 403 in order to improve the oxygen distribution and thus improve the RA distribution. Therefore, if the gas (the heating gas or the cooling gas) leaking from the underside of the substrate 403 is routed to the surface side of the substrate 403, the oxygen pressure in an end portion of the substrate 403 becomes low, and thus, uniformity may deteriorate. However, in the second embodiment, as mentioned above, the entry of the leaking gas into the oxidation process space 410 in which the surface of the substrate 403 is located can be reduced, and thus, the routing of the leaking gas to the surface of the substrate 403 can be reduced.

Preferably, when the edge portion of the dielectric portion 901 is located in proximity to the extending portion 405*a*, the edge portion does not contact the extending portion 405*a*, and a distance between the edge portion and the extending portion 405*a*, or equivalently, the width of the gap 415, is equal to or less than 3 mm. Such setting enables uniform evacuation with respect to a circumferential direction of the substrate even if the vacuum pump is located at any position.

Third Embodiment

Figure 9:
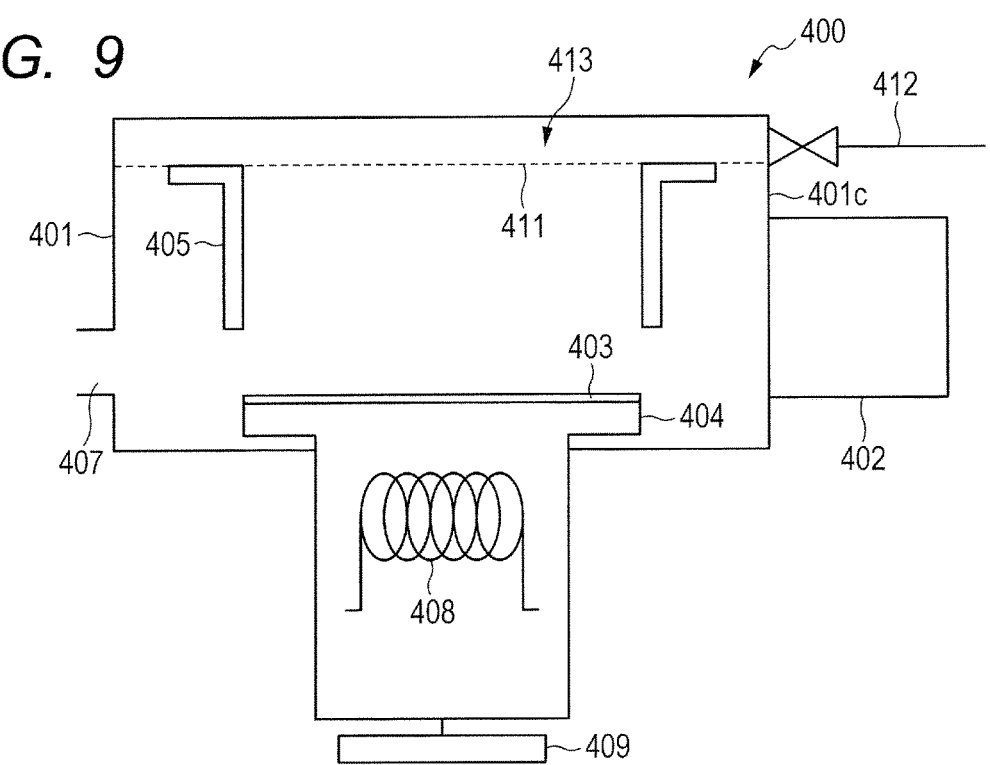
FIG. 9 is a schematic diagram illustrating the general configuration of the oxidation process apparatus according to one embodiment of the present invention.

In the above-mentioned embodiments, the oxygen introduction path 412 is provided in the wall (or upper wall) 401*a* of the processing chamber 401 facing the substrate holder 404; however, a location where the oxygen introduction path 412 is provided is not particularly limited. For example, as illustrated in FIG. 9, the oxygen introduction path 412 may be provided in a wall (or sidewall) 401*c* of the processing chamber 401 not facing the substrate holder 404.

Figure 10:
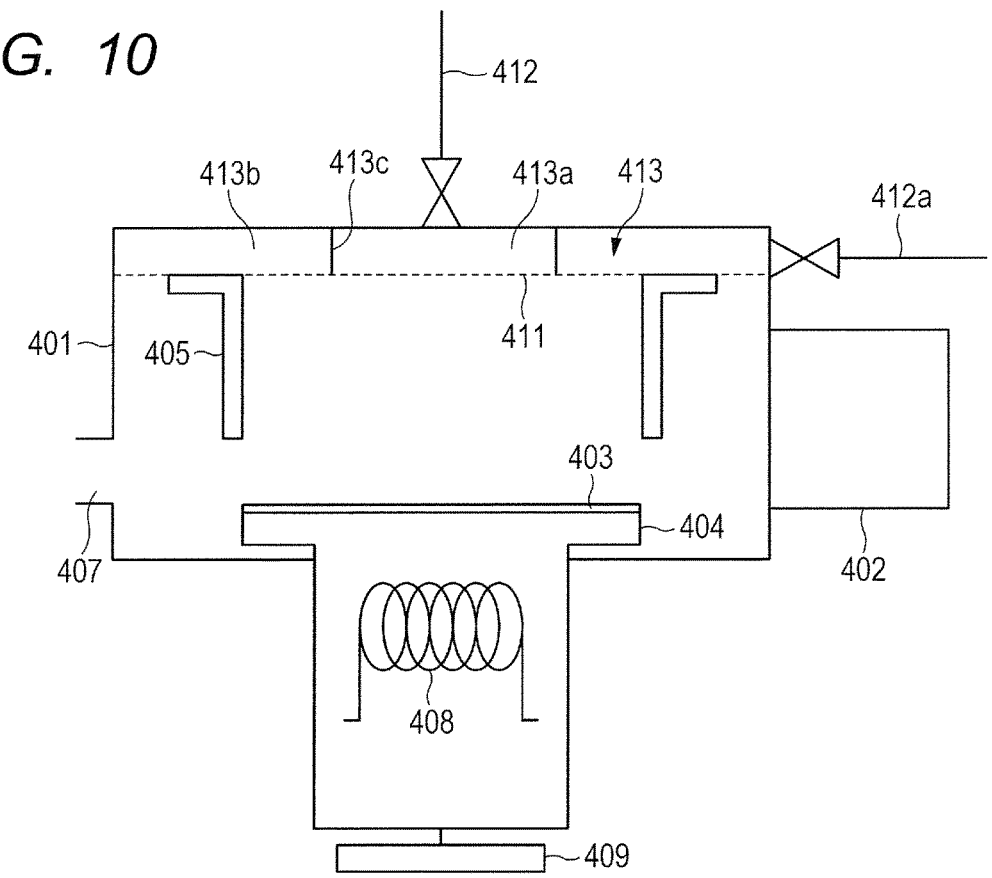
FIG. 10 is a schematic diagram illustrating the general configuration of the oxidation process apparatus according to one embodiment of the present invention.

In another example, a configuration may be such that for example, as illustrated in FIG. 10, the diffusion space 413 is divided into a central portion 413*a* and an outer peripheral portion 413*b*, the oxygen introduction path 412 is provided in the central portion 413*a*, and an oxygen introduction path 412*a* which is separate from the oxygen introduction path 412 is provided also in the outer peripheral portion 413*b*. The central portion 413*a* is partitioned by a cylindrical wall 413*c*. Therefore, the outer peripheral portion 413*b* is ring-shaped.

Moreover, in the above-mentioned embodiments, the substrate holder 404 is driven to form the oxidation process space 410 for subjecting the substrate 403 to the oxidation process; however, a mechanism for driving the cylindrical member 405 may be provided to drive the cylindrical member 405 and thus bring the cylindrical member 405 in proximity to the substrate holder 404 and thereby form the oxidation process space 410.

The invention claimed is:
1. An oxidation process apparatus for performing an oxidation process on a substrate comprising:
 a processing chamber;
 a substrate holder provided in the processing chamber and having a substrate holding surface for holding the substrate;
 an oxygen gas introduction means for introducing an oxygen gas into the processing chamber;
 a surrounding portion provided in the processing chamber, having a cylindrical portion with a circular cross-section perpendicular to an extending direction from a side of the oxygen gas introduction means to a side opposite to the oxygen gas introduction means; and
 a position changing means for changing relative positions of the substrate holder and the surrounding portion to allow the substrate holding surface and the surrounding portion to form a space,
 wherein the surrounding portion is provided so as to, during formation of the space, surround a side surface of the substrate holder and form a gap between the surrounding portion and the substrate holder,
 wherein the oxygen gas introduction means is provided so as to, during the oxidation process, introduce the oxygen gas restrictively into the space formed in the processing chamber,
 wherein the substrate holder comprises a dielectric portion having the substrate holding surface, a groove portion formed in the substrate holding surface, and a means for introducing at least one of a heating gas and a cooling gas into a second space formed in the groove portion between the substrate and the dielectric portion, when the substrate is held on the substrate holding surface, wherein the substrate holder is configured to move along a direction opposite to the extending direction in a hollow portion of the cylindrical portion of the surrounding portion and thus move in the space with a circular cross-section perpendicular to the extending direction, to form the gap between a side of the substrate holding surface and the cylindrical portion, and wherein the oxygen gas introduced into the space and the at least one of the heating gas and the cooling gas introduced into the second space are evacuated from the space and the second space through the gap.

2. The oxidation process apparatus according to claim 1, wherein the surrounding portion has an extending portion, and the extending portion is provided surrounding a region of the oxygen gas introduction means in which a portion thereof for introducing the oxygen gas restrictively into the space is provided, and the extending portion extends from the introducing portion side toward a side facing the introducing portion, and wherein the space is formed by the region, the extending portion, and the substrate holding surface.

3. The oxidation process apparatus according to claim 1, wherein the surrounding portion is provided in an upper portion in the processing chamber, and a transport port for the substrate is provided in a side portion of the processing chamber.

4. The oxidation process apparatus according to claim 2, wherein the surrounding portion is provided in an upper portion in the processing chamber, and a transport port for the substrate is provided in a side portion of the processing chamber, and wherein a tip of the extending portion of the surrounding portion is located at a height position in a vicinity of an upper end of the transport port.

5. The oxidation process apparatus according to claim 3, wherein the oxygen gas introduction means comprises:
a shower plate having many holes;
a gas diffusion space formed by the shower plate and a portion of an inner wall of the processing chamber; and
a gas introduction port for introducing the oxygen gas into the gas diffusion space,
wherein the space is formed by the shower plate, the extending portion, and the substrate holding surface.

6. The oxidation process apparatus according to claim 5, wherein a volume of the space lies within a range of 0.0042 m³ to 0.012 m³.

7. The oxidation process apparatus according to claim 5, wherein the shower plate and the substrate holding surface are arranged facing each other, and a distance between the shower plate and the substrate holding surface lies within a range of 0.042 m to 0.12 m.

8. The oxidation process apparatus according to claim 2, wherein a cross section of the surrounding portion, taken perpendicularly to an extending direction of the surrounding portion, has a similar shape to an external shape of the substrate holding surface.

9. The oxidation process apparatus according to claim 2, wherein the means for changing the relative positions is configured to move the substrate holder in a direction closer to the region and in a direction away from the region, and is configured to, during the formation of the space, move the substrate holder in the direction closer to the region and thereby house the substrate holding surface within the surrounding portion.

10. The oxidation process apparatus according to claim 9, wherein the substrate holder comprises an overhang region overhanging in a direction perpendicular to the direction of movement, and a distance between the overhang region and the surrounding portion is equal to or less than 3 mm.

11. The oxidation process apparatus according to claim 10, wherein the overhang region has a predetermined thickness in the direction of movement, and during the oxidation process, the oxygen gas is introduced into the space in a state where the substrate holder is housed within the surrounding portion by at least the predetermined thickness.

12. The oxidation process apparatus according to claim 9, wherein evacuation conductance of the gas from the space through the gap does not change even when the means for changing the relative positions moves the substrate holding surface in the surrounding portion in the direction closer to the region and in the direction away from the region.

13. The oxidation process apparatus according to claim 1, further comprising a heating device provided in the substrate holder, wherein a side surface of the dielectric portion is disposed in proximity to an extending portion of the surrounding portion.

14. The oxidation process apparatus according to claim 1, wherein the substrate holder further comprises an electrode for electrostatic attachment of the substrate.

15. The oxidation process apparatus according to claim 1, wherein an inner wall of the surrounding portion is polished.

16. An oxidation method, wherein the oxidation process apparatus according to claim 1 is used to perform an oxidation process on a film deposited on the substrate.

17. An oxidation method for performing an oxidation process on a substrate in a processing chamber provided internally with a substrate holder including a dielectric portion having a substrate holding surface for holding the substrate, and a groove portion formed in the substrate holding surface, and provided with an oxygen gas introduction means for introducing an oxygen gas into the processing chamber, the method comprising the steps of:
holding the substrate on the substrate holding surface;
introducing at least one of a heating gas and a cooling gas into a second space formed in the groove portion between the substrate and the dielectric portion;
changing a relative position of the substrate holder with respect to the processing chamber thereby to form, in the processing chamber, a space formed by the substrate holding surface and a surrounding portion provided in the processing chamber, the surrounding portion having a cylindrical portion with a circular cross-section perpendicular to an extending direction from a side of the oxygen gas introduction means to a side opposite to the oxygen gas introduction means, wherein the space is formed so that a side surface of the substrate holder is surrounded by the surrounding portion and a gap is formed between the surrounding portion and the substrate holder, the gap being formed between a side of the substrate holding surface and the cylindrical portion; and
performing the oxidation process on the substrate held on the substrate holding surface, by introducing an oxygen gas restrictively into the space,
wherein the substrate holder is configured to move in the space along an extending direction of the surrounding portion, and wherein the oxygen gas introduced into the space and the at least one of the heating gas and the cooling gas introduced into the second space are evacuated from the space and the second space through the gap.

18. The oxidation method according to claim 17, wherein the step of performing the oxidation process includes introducing the oxygen gas by a shower plate disposed in such a way as to face the substrate holder.

19. The oxidation method according to claim 17, wherein the substrate holder comprises a heating device,
   wherein a side surface of the dielectric portion is disposed in proximity to an extending portion of the surrounding portion, and
   wherein the step of performing the oxidation process includes performing the oxidation process, while heating the substrate by the heating device.

20. A method for manufacturing an electronic device by using the oxidation method according to claim 17.

21. The oxidation process apparatus according to claim 1, wherein the substrate holder comprises an overhang region overhanging in a direction perpendicular to the extending direction, and
   wherein the substrate holder is configured to move in the space to form the gap between the overhang region and the cylindrical portion forming a part of the surrounding portion.

22. The oxidation process apparatus according to claim 1, wherein the substrate holder comprises an overhang region overhanging in a direction perpendicular to the extending direction and a non-overhang region other than the overhang region, and
   wherein the substrate holder is configured to move in the space to form the gap including a first gap formed between the overhang region and the cylindrical portion forming a part of the surrounding portion and a second gap formed between the non-overhang region and the cylindrical portion, the second gap being wider than the first gap.

23. The oxidation method according to claim 17, wherein the substrate holder comprises an overhang region overhanging in a direction perpendicular to the extending direction, and
   wherein the substrate holder is configured to move in the space to form the gap between the overhang region and the cylindrical portion forming a part of the surrounding portion.

24. The oxidation method according to claim 17, wherein the substrate holder comprises an overhang region overhanging in a direction perpendicular to the extending direction and a non-overhang region other than the overhang region, and
   wherein the substrate holder is configured to move in the space to form the gap including a first gap formed between the overhang region and the cylindrical portion forming a part of the surrounding portion and a second gap formed between the non-overhang region and the cylindrical portion, the second gap being wider than the first gap.

* * * * *